(12) United States Patent
Weingartner et al.

(10) Patent No.: US 6,297,666 B1
(45) Date of Patent: Oct. 2, 2001

(54) FULLY PROGRAMMABLE AND CONFIGURABLE APPLICATION SPECIFIC INTEGRATED CIRCUIT

(75) Inventors: Thomas A. Weingartner; Paul J. Short; Mark A. Espelien; Jordon W. Woods, all of Albuquerque, NM (US)

(73) Assignee: InnoVasic, Inc., Albuquerque, NM (US)

(*) Notice: Subject to any disclaimer, the term of this patent is extended or adjusted under 35 U.S.C. 154(b) by 0 days.

(21) Appl. No.: 09/447,525

(22) Filed: Nov. 23, 1999

Related U.S. Application Data

(60) Provisional application No. 60/110,049, filed on Nov. 24, 1998.

(51) Int. Cl.[7] .................................................. H01L 25/00
(52) U.S. Cl. ................................ 326/41; 326/38; 326/39
(58) Field of Search .................................. 326/38, 39, 41

(56) References Cited

U.S. PATENT DOCUMENTS

| | | | |
|---|---|---|---|
| 4,896,296 | 1/1990 | Turner et al. | 365/189.08 |
| 5,317,211 | * 5/1994 | Tang et al. | 307/465 |
| 5,336,951 | 8/1994 | Josephson et al. | 307/465 |
| 5,550,839 | 8/1996 | Buch et al. | 371/22.1 |
| 5,640,107 | 6/1997 | Kruse | 326/38 |
| 5,682,107 | 10/1997 | Tavana et al. | 326/41 |
| 5,687,325 | 11/1997 | Chang | 395/284 |
| 5,705,938 | 1/1998 | Kean | 326/39 |
| 5,737,235 | * 4/1998 | Kean et al. | 364/490 |
| 5,765,027 | 6/1998 | Wang et al. | 395/860 |
| 5,815,405 | 9/1998 | Baxter | 364/489 |
| 5,821,776 | 10/1998 | McGowan | 326/41 |
| 5,825,202 | 10/1998 | Tavana et al. | 326/39 |
| 5,841,790 | 11/1998 | Salem et al. | 371/22.1 |
| 5,844,917 | 12/1998 | Salem et al. | 371/22.1 |
| 5,867,037 | 2/1999 | Capps, Jr. et al. | 326/38 |
| 5,874,834 | 2/1999 | New | 326/39 |

FOREIGN PATENT DOCUMENTS

| | | |
|---|---|---|
| 06-275718 | 9/1994 | (JP). |
| WO 95/16993 | 6/1995 | (WO). |
| WO 98/13938 | 4/1998 | (WO). |

OTHER PUBLICATIONS

"Programmable Architectural Array" by E.H. Stoops. IBM Technical Disclosure Bulletin, vol. 19, No. 12, May, 1977, p. 4569.

"Programmable Arrays Mix FPGA and ASIC Blocks" by D. Bursky. Electronic Design, vol. 44, No. 21, pp. 69–70, 72, 74. Oct. 14, 1996. Abstract only.

"ASIC Core in FPGA Integration" by W. Miller. Elektronik Industrie, vol. 28, No. 8, pp. 36, 38, 40. 08/97. Abstract only.

* cited by examiner

*Primary Examiner*—Michael Tokar
*Assistant Examiner*—Anh Q. Tran
(74) *Attorney, Agent, or Firm*—Jeffrey D. Myers; Andrea L. Mays

(57) ABSTRACT

A method and apparatus for a fully programmable and configurable application specific integrated circuit (FPCA). Programmable I/O cells are programmed for selected electrical characteristics, including power and ground. The circuit contains a functional core for programming the circuit, programmable I/O leads to connect to the programmable I/O cells, and programming logic and control for programming the functional core and I/O cells. Certain leads double as programmable I/O leads and programming control leads, and are used to communicate with the programming logic and control and the I/O cells. A method of programming the FPCA comprises the steps of asserting the programming control signal; applying programming voltage and ground to a respective two designated I/O cells' leads; isolating a plurality of the I/O cells from the programming signal; and programming an FPGA array in addition to the isolated I/O cells of the circuit.

9 Claims, 5 Drawing Sheets

FULLY PROGRAMMABLE AND CONFIGURABLE APPLICATION SPECIFIC INTEGRATED CIRCUIT

CROSS-REFERENCE TO RELATED APPLICATIONS

This application claims the benefit of the filing of U.S. Provisional patent application Ser. No. 60/110,049, entitled "Fully Programmable and Configurable Application Specific Integrated Circuits," filed on Nov. 24, 1998, and the specification thereof is incorporated herein by reference.

BACKGROUND OF THE INVENTION

1. Field of the Invention (Technical Field)

The present invention relates to the field of integrated circuits, particularly field programmable gate arrays and application specific integrated circuits.

2. Background Art

Application Specific Integrated Circuits (ASICs) provide electronic designers with the ability to customize circuits by integrating complex functionality and input/output (I/O) on a single integrated circuit (IC). Field Programmable Gate Arrays (FPGAs) provide electronic designers with similar capabilities, and additionally allow functions and I/O to be programmed rather than fixed during production. The ability to program has the advantage of providing design flexibility and faster implementation during the system development effort. Furthermore, for low volumes and prototyping, an FPGA has a lower unit cost than an ASIC. Although FPGAs are flexible, allow for faster implementation, and have low unit costs, there are limits to the function complexity and the I/O capability.

Other inventions have attempted to address configuration problems existing in integrated circuits. However, none address the problem of assigning any signal to any device's pin, or lead, with selectable I/O electrical characteristics (hereinafter "pin" and "lead" shall each be understood to encompass the other). Furthermore, none disclose the ability to program power and ground to any device's lead. U.S. Pat. No. 5,705,938, to Kean, entitled "Programmable Switch for FPGA Input/Output Signals," discloses device pins that are usable once the FPGA has been programmed instead of having dedicated programming pins. However, in this invention, the power and ground pins are still dedicated and not configurable. PCT Application Publication No. WO98/13938, to Xilinx, Inc., entitled "Integrated Circuit with Field Programmable and Application Specific Logic Areas," discloses routing any signal to any input/output pad. However, the technology never discloses the ability to select electrical characteristics of the pad or allowing any of the pads to take on power and ground characteristics. PCT Application Publication No. WO95/16993, to Lattice Semiconductor Corporation, entitled "Application Specific Modules in a Programmable Logic Device," discloses programming an input/output cell, but the input/output cell is limited to being defined as input, output, and bi-directional. The input/output cell is not described as taking on power and ground electrical characteristics. U.S. Pat. No. 5,825,202, to Tavana et al., entitled "Integrated Circuit with Field Programmable and Application Specific Logic Areas," combines FPGA with "application specific logic area" to provide flexible functionality with user defined functionality on the same die. This patent does not discuss the input/output for the IC or flexibility of the input/output. U.S. Pat. No. 4,896,296, to Turner et al., entitled "Programmable Logic Device Configurable Input/Output Cell" discloses adding in-system programming capability to a PLD as well as allowing the PLD to be configured with a non-volatile switch or memory element. Unlike the present invention, the I/O cell in this patent is not designed so that a pin can take on varying electrical characteristics.

U.S. Pat. No. 5,867,037, to Capps, Jr. et al., entitled "Method and Apparatus of Programming FPGA Devices Through ASIC Devices," discloses a mechanism to program FPGAs using an ASIC and does not describe programmability features of the input/output. U.S. Pat. No. 5,844,917, to Salem et al., entitled "Method for Testing Adapter Card ASIC Using Reconfigurable Logic," discloses a method to test an ASIC using an FPGA. U.S. Pat. No. 5,841,790, also to Salem et al., entitled "Apparatus for Testing an Adapter Card ASIC with Reconfigurable Logic," discloses an apparatus to test an ASIC using an FPGA. U.S. Pat. No. 5,821,776, to McGowan, entitled "Field Programmable Gate Array with Mask Programmed Analog Function Circuits," extends FPGA technology to include analog functions with digital functions, all in a single FPGA device. I/O pads can be interconnected to either a digital function or an analog function, but not extending the interconnect to include power and ground. U.S. Pat. No. 5,765,027, to Want et al., entitled "Network Controller Which Enables the Local Processor to have Greater Access to at least One Memory Device than the Host Computer in Response to a Control Signal," discloses an application of an ASIC/FPGA in a networking system. U.S. Pat. No. 5,687,325, to Chang, entitled "Application Specific Field Programmable Gate Array," ties together specific digital function with a general purpose FPGA. This patent does not disclose configurable I/O or selectable electrical characteristics.

An article authored by D. Bursky, entitled "Programmable Arrays Mix FPGA and ASIC Blocks," published in *Electronic Design*, Vol. 44, No. 21, pp. 60–70, 72, 74, describes the need for more efficient FPGA architectures to produce small chips, but does not mention configurable input/output or selectable electrical characteristics. An article authored by W. Miller, entitled ASIC Core in FPGA Integration, published in *Electronic Industry*, Vol. 28, No. 8, p. 36–38, 40, describes a product that has FPGA technology with pre-defined logic blocks, in other words, pre-defined functionality, but does not mention configurable I/O or selectable electrical characteristics.

U.S. Pat. No. 5,874,834, to New, entitled "Field Programmable Gate Array with Distributed Gate-Array Functionality," discloses pre-defined functions in a sea-of-gates gate array, but does not mention configurable input/output or selectable electrical characteristics. U.S. Pat. No. 5,815,405, to Baxter, entitled "Method and Apparatus for Converting a Programmable Logic Device Representation of a Circuit into a Second Representation of the Circuit," discloses how to convert representations of a circuit from one form to another for PLDs. U.S. Pat. No. 5,682,107, to Tavana et al., entitled "FPGA Architecture with Repeatable Tiles Including Routing Matrices and Logic Matrices," refines FPGA architecture but does not have configurable I/O. U.S. Pat. No. 5,640,107, to Kruse, entitled "Method for In-Circuit Programming of a Field-Programmable Gate Array Configuration Memory," discloses a method for reprogramming an FPGA when it is in a circuit as opposed to programming the device separately, but does not disclose configurable input/output or selectable electrical characteristics. U.S. Pat. No. 5,550,839, to Buch et al., entitled "Mask-Programmed Integrated Circuits Having Timing and Logic Compatibility to User-Configured Logic Arrays," discloses the ability to produce mask programmable devices from FPGAs without the need for simulating the logic and timing to verify that the mask programmable device will operate once produced. An article by E. H. Stoops, entitled "Programmable Architectural Array," published in *The IBM Technical Disclosure Bulletin*, Vol. 19, No. 12, May 1977, discloses a mechanism for being able to program a function into a chip, which is a precursor to the FPGA. However, the article does not mention configurable I/O or selectable electrical characteristics. The abstract to Japanese Patent 06-275718, to Takeo Niifuna, entitled "Gate Array Circuit," discloses a means for having dedicated functions and programmable functions on a single chip, but not configurable I/O or selectable electrical characteristics.

The present invention solves the I/O limitation problem of ICs. This is important because electronic designers need the ability to provide for a pin-for-pin compatible IC for an existing IC in a system. This capability is necessary because manufacturers of ICs routinely make them obsolete for various reasons over time. When a manufacturer makes an IC obsolete, electronic designers who use that IC have no other option than to redesign the system, buy a lifetime supply of ICs, or design a compatible ASIC. All of these options are expensive, and a compatible ASIC is particularly expensive in low volume situations. A compatible FPGA, while desirable because of its low cost/low volume considerations, is not an option because of its I/O limitations. Although an FPGA is ideally suited for replacing an existing IC in terms of design flexibility, fast implementation, and low cost in low volumes, the I/O is not flexible enough to provide for a pin-for-pin compatible solution with an existing IC. Packaging can be used to take care of some of the FPGA's I/O limitations, but then the cost of the packaging creates an additional expense and can make it cost-prohibitive.

The present invention takes advantage of hardware description language (HDL) design and synthesis for ASICs, as well as the design advantages of FPGAs. The present invention uses erasable non-volatile memory (NVM) technology in addition to FPGA technology. The use of erasable NVM is required so that the present invention can be programmed without the use of external program memory. This feature is also necessary so that the program can be changed when required. The present invention combines the features of an ASIC and an FPGA so that an integrated circuit can have complete programmability in both function and in I/O signals. The use of non-volatile memory and programming allows the present invention to route any signal to any lead on the IC and to select the electrical characteristics for the signal. Power and ground are included as selectable electrical characteristics for any given signal. Programmable power and ground is provided so that the I/O of the device can be completely configurable. Furthermore, the programmability of the present invention does not require dedicated programming pins.

SUMMARY OF THE INVENTION
(DISCLOSURE OF THE INVENTION)

The present invention is a fully programmable and configurable application specific integrated circuit (FPCA). The FPCA comprises a functional core for programming the circuit, programmable I/O cells to be programmed for selectable electrical characteristics for the FPCA signals, programmable I/O leads for connecting with the programmable I/O cells, I/O pads routed to the programmable I/O cells, programming logic and control for programming the functional core and I/O cells, and programming control leads for communicating with the programming logic and control through the I/O pads. The functional core comprises digital logic gates, and is preferably an FPGA array of gates. Some of the programmable I/O leads double as programming control leads.

The programmable I/O cells can be programmed to accommodate different logic types, such as TTL, CMOS, and Schmitt trigger. The programmable I/O cells can be programmed for selectable electrical characteristics which include power and ground. The cells can be programmed as inputs which include input only, input with pull-up, input with pull-down, crystal oscillator clocks, inverting clocks, and non-inverting clocks. In the alternative, the I/O cells can be programmed as outputs, such as output only, output with pull-up, output with pull-down, output with slew rate, tri-state, tri-state with pull-up, tri-state with pull-down, tri-state with slew rate, slew rate with pull-up, slew-rate with pull-down, crystal oscillator clocks, inverting clocks, and non-inverting clocks. Furthermore, the programmable I/O cells could be programmed to be bi-directional input/output. Metal layers are used for routing circuit signals throughout the FPCA. The FPCA further preferably comprises non-volatile memory for selecting the electrical characteristics and non-volatile programming for routing any signal to any lead on the FPCA.

The present invention is also of a method of fully programming and configuring the FPCA comprising selecting electrical characteristics for the circuit signals; connecting programming I/O leads to programmable I/O cells; routing I/O pads to the I/O cells; providing programming logic and control for programming a functional core and the programmable I/O cells; communicating with the programming logic and control and the I/O cells with at least one programming control lead; programming the functional core of the circuit; and programming the I/O cells for the selected electrical characteristics. Programming the functional core of the circuit preferably comprises programming the digital logic gates within that functional core. Communicating with the programming logic and control and the I/O cells with the programming control leads comprises communicating through the same lead as the programming I/O leads.

Selecting electrical characteristics for the circuit signals preferably comprises selecting logic types for the programmable I/O cells, which can be TTL, CMOS, and Schmitt trigger. Programming and configuring the FPCA further comprises routing the circuit signals with the metal layers on the FPCA. Selecting the electrical characteristics for the circuit signals comprises selecting characteristics from a non-volatile memory. Programming the programmable I/O cells for the selected electrical characteristics comprises routing any signal to any lead with non-volatile programming.

Routing any signal to any lead with non-volatile programming preferably comprises configuring the programmable I/O cells with either a non-volatile switch element or a fuse element. Selecting electrical characteristics for circuit signals can comprise selecting electrical characteristics for each of the I/O cells and these characteristics can be either input, output, bi-directional I/O, power, or ground. Selecting an electrical characteristic for each of the I/O cells comprises programming each of the I/O cells with an input such as input only, input with pull-up, input with pull-down, crystal oscillator clocks, inverting clocks, or non-inverting clocks. In the alternative, selecting an electrical characteristic for each of the I/O cells can comprise programming each of the I/O cells as an output. Available outputs include output only, output with pull-up, output with pull-down, output with slew rate, tri-state, tri-state with pull-up, tri-state with pull-down, tri-state with slew rate, slew rate with pull-up, slew-rate with pull-down, crystal oscillator clocks, inverting clocks, and non-inverting clocks.

The present invention is further of a method for programming the FPCA comprising asserting the programming control signal, applying programming voltage and ground to a respective two designated I/O cells' leads; isolating a plurality of I/O cells from the programming signal; and programming an FPGA array and the isolate I/O cells of the circuit. Isolating a plurality of I/O cells from the programming signals preferably comprises providing a control signal to isolate the programming signals from the I/O cells upon application of programming voltage and ground to a respective two designated I/O cells' leads. Isolating a plurality of I/O cells from the programming signals can be accomplished by isolating a plurality of I/O cells from the programming signals with a mechanism which can include multiplexers, tri-state buffers, and signal switching mechanisms. Various programming signals are used to program the FPGA array and isolated I/O cells of the circuit. These programming signals include programming voltage, programming ground, programming read/write, programming control, and programming data. The FPGA array and isolated I/O cells can be programmed with either a programming station or a probe station. Programming the FPGA array and the isolated I/O cells of the circuit can be accomplished by transferring programmed data to non-volatile memory with logic and control circuitry.

The invention is still further of a method for designing the FPCA comprising specifying the function for the FPCA, partitioning, capturing the design, verifying the function, synthesizing a netlist, generating an FPCA netlist with a synthesis library for the circuit, generating a programming file from the netlist, and programming the circuit during wafer probe.

A primary object of the present invention is to provide an integrated circuit device that can be programmed to be form-compatible, fit-compatible and function-compatible with an existing digital integrated circuit.

Another object of the present invention is to provide an ASIC that can be programmed so that any I/O lead can take on any digital IC electrical characteristic, including power and ground.

A further object of the present invention is to provide programmable I/O leads that can take on electrical characteristics, including different switching characteristics such as TTL, CMOS, and Schmitt trigger.

A primary advantage of the present invention is that the device can be programmed with any function that can be described using digital design techniques.

Another advantage of the present invention is that it can be programmed either with a device probe station or as a packaged IC.

Still another advantage of the present invention is that the programming is non-volatile.

Yet another advantage of the present invention is that it can be packaged in any IC packaging technology.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS (BEST MODES FOR CARRYING OUT THE INVENTION)

The present invention is a fully programmable and configurable ASIC (hereinafter referred to as an "FPCA") and embodies both programmable power and ground, as well as transparent and non-volatile programming, i.e., there are no leads dedicated to programming, and is applicable to digital integrated circuits. In the preferred embodiment, these two features can be combined with any programmable device technology, for example complex programmable logic devices (CPLDs) and FPGAs manufactured by GateField, Altera, and Xilinx. Regardless of the size of the IC functional core or the type of I/O it can support, the programmable power and ground and transparent programming components of the present invention are applicable. The FPCA can be configured using not only a non-volatile switch or memory element, but also a fuse type element.

Figure 1:
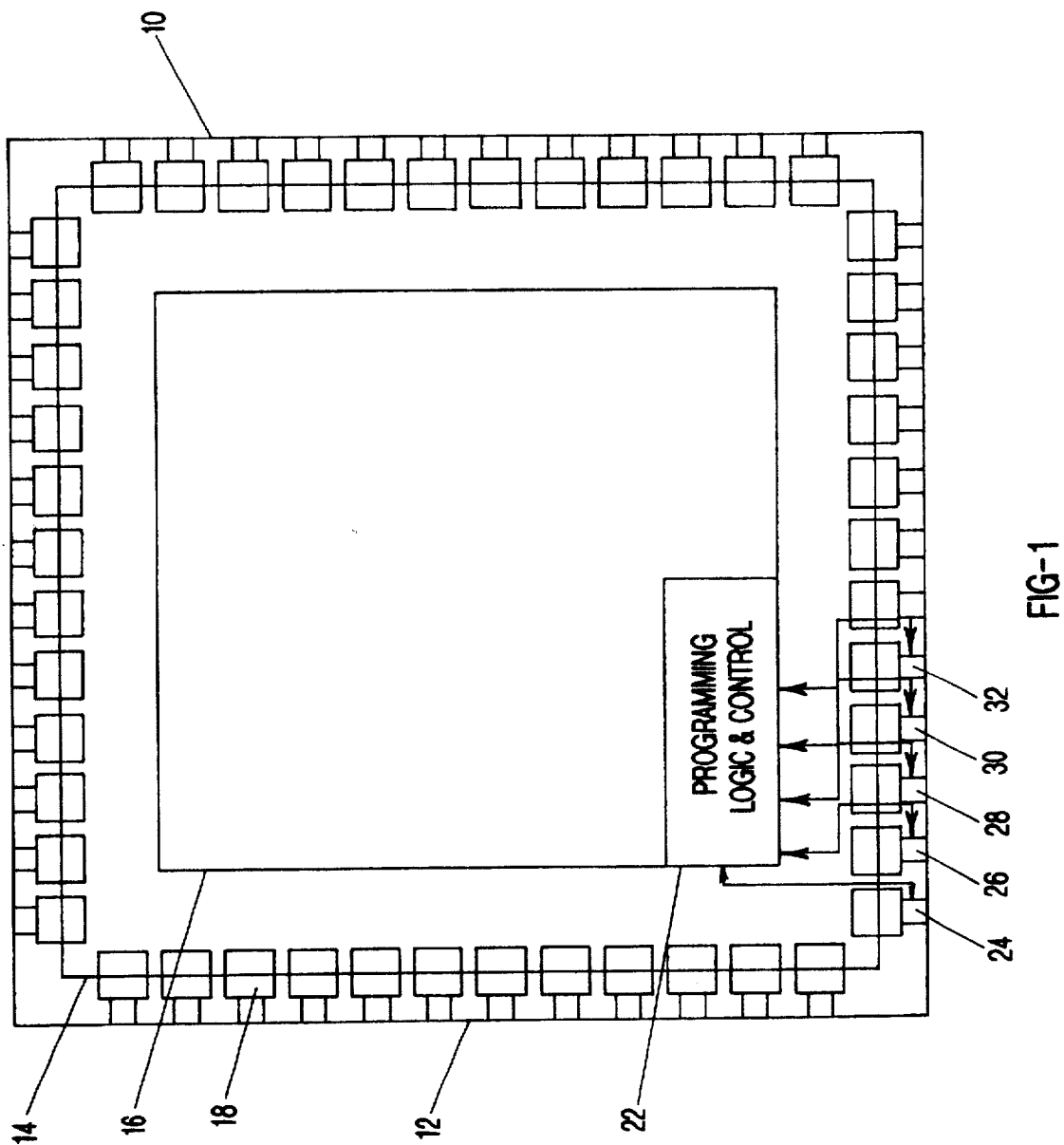
FIG. 1 is an overview of the architecture of the preferred embodiment of the present invention.

Attention is now directed to the figures. FIG. 1 is an overview of the FPCA architecture 10. The semiconductor die outline is shown at 12 of FPCA 10. Metal layers 14 are shown for routing the FPCA signals. Functional core 16 is shown in the center of FPCA 10. Functional core 16 is where FPCA 10 is programmed. A programmable I/O cell, for example at 18, provides the connection where the I/O of FPCA 10 is programmed. Bonding pads, or I/O pads, for each I/O cell are shown, for example, at 20. Programming logic and control 22 provides logic for controlling the programming of FPCA functional core 16 and I/O cells. Programming control is accomplished through pads 24, 26, 28, 30 and 32.

In the preferred embodiment, an FPGA is used to form the FPCA. The preferred embodiment also has a selected number of digital logic gates in the functional core, a selected number of I/O cells with programmable power and ground, and specific packaging for housing the FPCA.

Variations on the preferred embodiment lead to other embodiments of the FPCA. Examples of packages, die sizes, and number of I/Os supported for various configurations of FPCA 10 are given in Table 1.

TABLE 1

| FPCA Embodiment | Die Size | Number of I/O Available | Number of Gates | Packages |
|---|---|---|---|---|
| 1 | 3.75 mm² | 64 | 4K | 8–64 Lead Dip |
| 2 | 6 mm² | 104 | 18K | 20–84 Lead LCC |
| 3 | 9 mm² | 160 | 35K | 80–160 Lead QFP |

These other embodiments are implemented by varying the number of gates in the functional core and the number of I/O cells. The die for the FPCA can of course be scaled to accommodate any range of sizes in the functional core and number of I/O cells and is not to be limited to those embodiments presented in Table 1. Whether contained in a 16 Lead CDIP, in a 44 Lead plastic leaded chip carrier (PLCC), or in a 100 Lead plastic quad flat pack (PQFP), the concepts and advantages of the FPCA are applicable.

Figure 2:
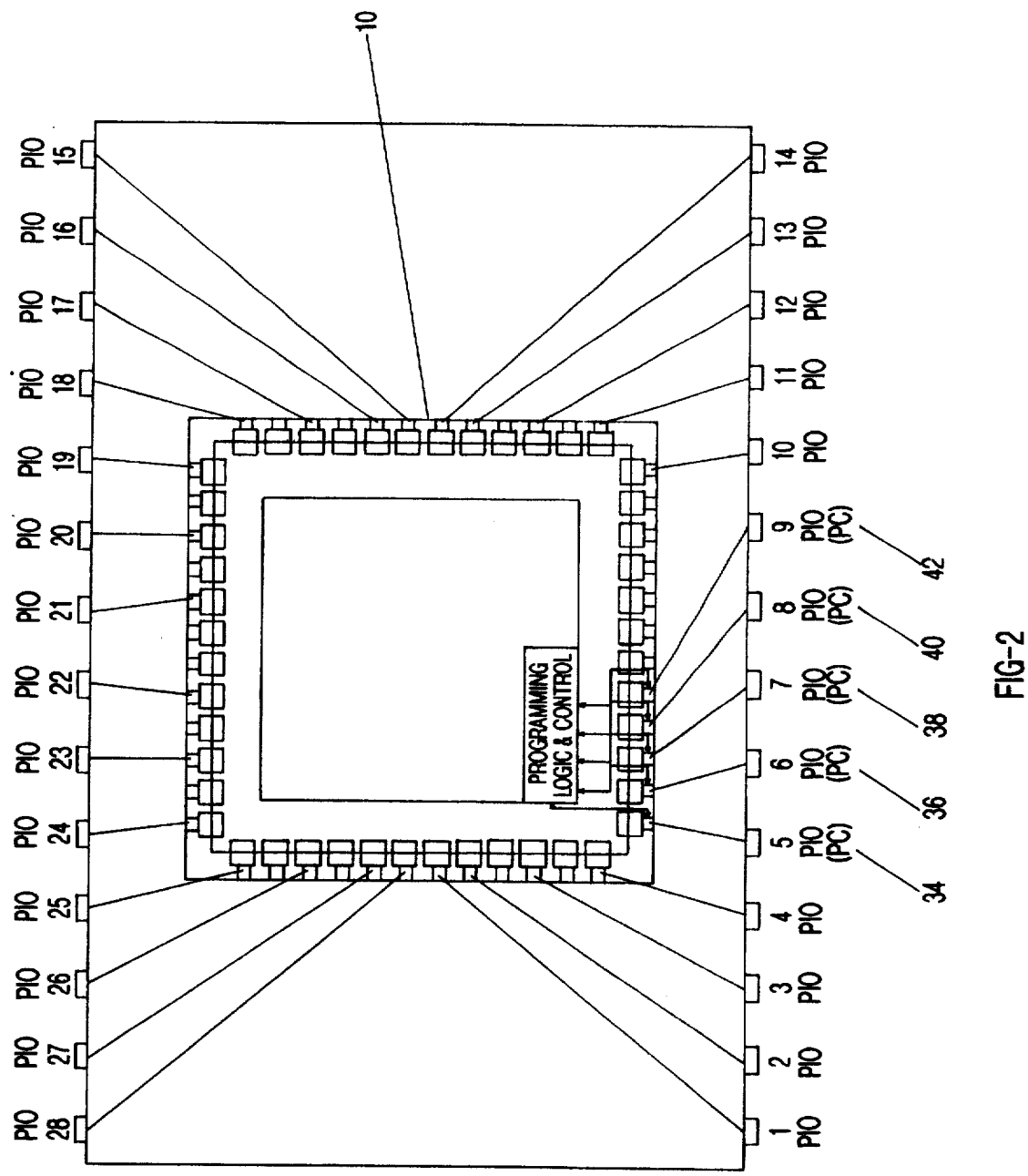
FIG. 2 is an overview of the architecture for the preferred embodiment of the present invention packaged in a 28 lead plastic dual inline package (PDIP)

FIG. 2 is an example package for a 28 Lead PDIP. All leads shown in FIG. 2 are labeled programmable I/O (PIO) because each of the device's leads has an I/O cell associated with it that can be programmed. Programming each I/O cell configures the device lead for selectable electrical characteristics. Possible selectable electrical characteristics are summarized in Table 2.

TABLE 2

| Available I/O Types | TTL, CMOS, Schmitt trigger, Power, Ground |
|---|---|
| Available Inputs | Input Only, Input w/Pull-up, Input w/Pull-down, Crystal Oscillator Clock, Inverting Clock, Non-Inverting Clock |
| Available Outputs | Output Only, Output w/Pull-up, Output w/Pull-down, Output w/Slew Rate, Tri-state, Tri-state w/Pull-up, Tri-state w/Pull-down, Tri-state w/Slew Rate, Slew Rate w/Pull-up, Slew Rate w/Pull-down, Crystal Oscillator Clock, Inverting Clock, Non-Inverting Clock |
| Available Output Drive | 2 mA, 4 mA, 8 mA, 12 mA, 24 mA, 36 mA |
| Bi-Directional | Any combination of Input and Tri-State Output |

Each I/O cell can be programmed to have power and ground electrical characteristics thereby enabling any lead of the device to be configured as a power or ground.

Figure 3:
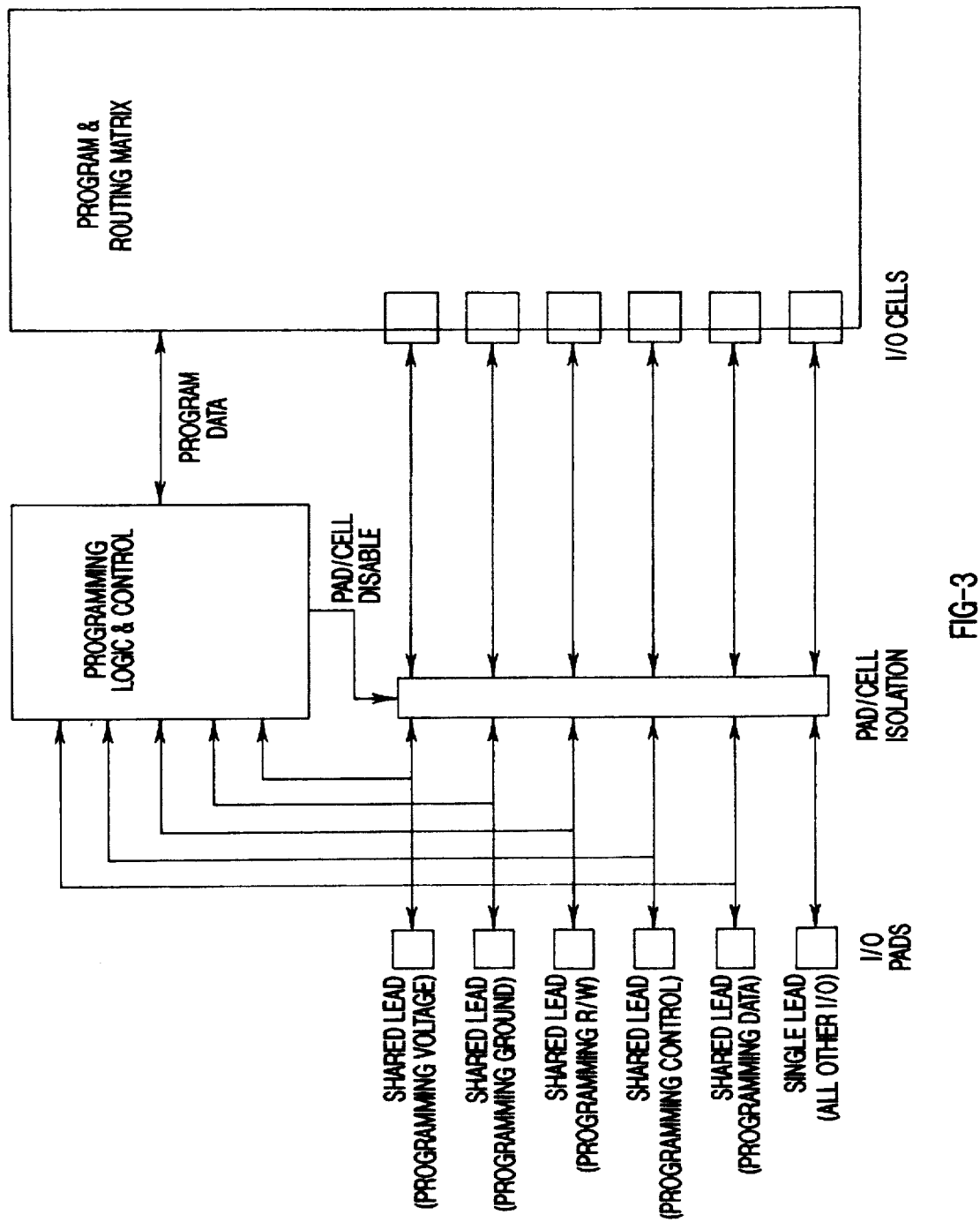
FIG. 3 is a functional block diagram of the preferred embodiment of the programming mechanism for the present invention.

As shown in FIG. 2, certain leads such as 34, 36, 38, 40 and 42 double as programming leads. The leads that double as I/O and programming leads are also labeled program control (PC). These leads have an I/O pad that is routed to both the I/O cell and the programming logic and control area on the die. This routing allows programming voltages from the programmer to bypass the I/O cells. Programming control is provided through these leads by the programmer. There are five signals that are used to program the FPGA array and I/O cells of the FPCA: 1) Programming Voltage, 2) Programming Ground, 3) Programming Read/Write, 4) Programming Control, and 5) Programming Data. The functional block diagram of the FPCA programming mechanism is shown in FIG. 3. Asserting the Programming Control signal prepares the device for programming by isolating the I/O cells from the programming signals. When programming voltage and ground are applied to the two designated leads on the FPCA, the programming and logic control circuitry in the FPCA provides a control signal to isolate the five programming signals from the I/O cells. This isolation can be accomplished with multiplexers, tri-state buffers, or other common signal switching mechanisms. Next, the FPCA programming mechanism, either a programming station or probe station, proceeds with programming the FPGA array and isolated I/O cells. Programming the array and cells is accomplished in the same fashion as programming EEPROM or anti-fuse based FPGAs. Whether the device is programmed via a probe station or a programming station, logic and control circuitry is responsible for transferring programmed data to the non-volatile memory, thereby configuring the FPCA.

Figure 5:
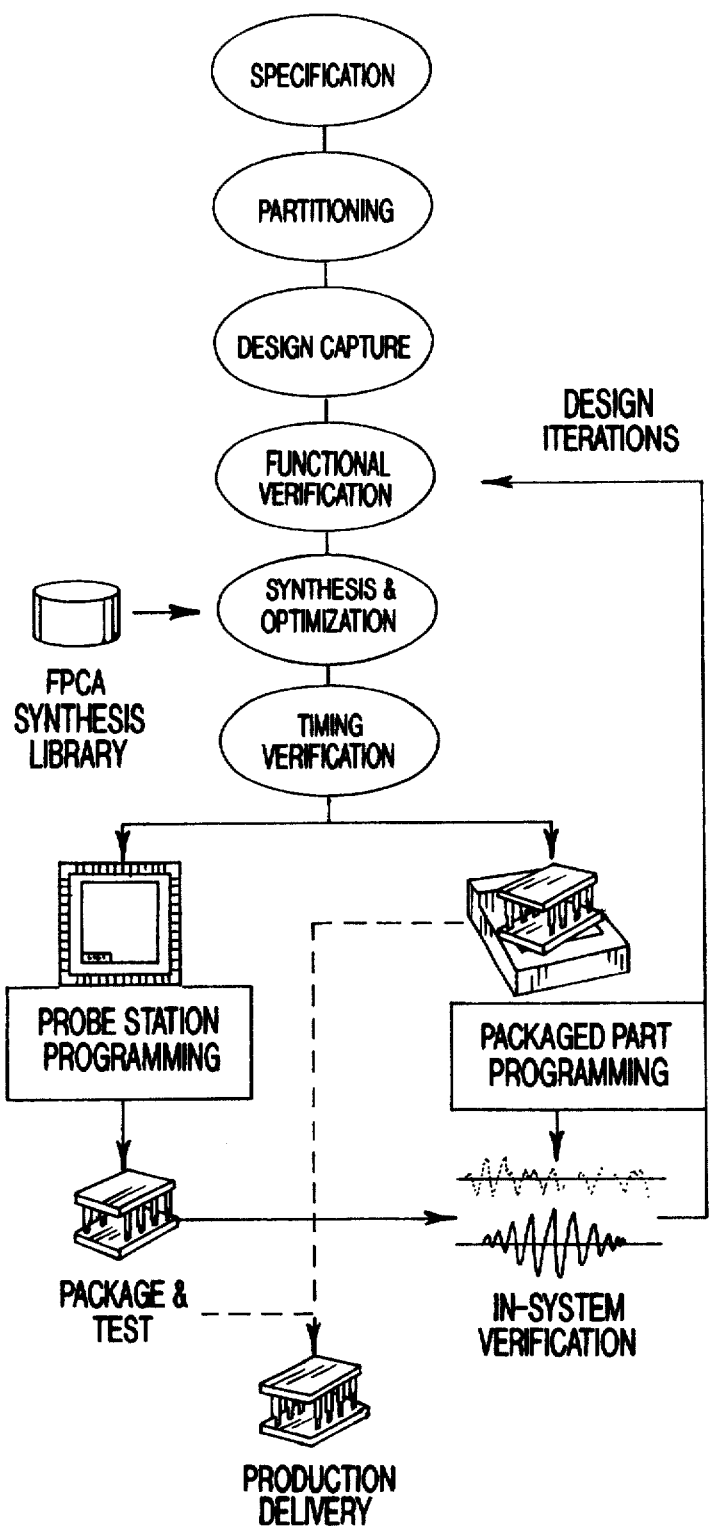
FIG. 5 is a flow diagram summarizing the design flow of the present invention as adapted to a typical ASIC/FPGA design flow.

The present invention fits easily into standard ASIC and FPGA design process flows as shown in FIG. 5. Traditional steps of ASIC and FPGA design are used up through synthesizing a netlist. At that point, a synthesis library for the FPCA is used to generate a device netlist. A programming file is generated from the netlist. This file is used to program the FPCA either at the die level or as a packaged device. Taking the left path in the flow diagram shown in FIG. 5 is typical for an ASIC with the exception that a step is added to program the FPCA during wafer probe. To design an FPGA, typically the right path is taken in the flow diagram shown in FIG. 5 where the device is programmed at a programming station. If the device from either path does not verify in the actual system, it can be reprogrammed until it works in the system.

Industrial Applicability

The invention is illustrated by the following non-limiting example.

EXAMPLE

Figure 4:
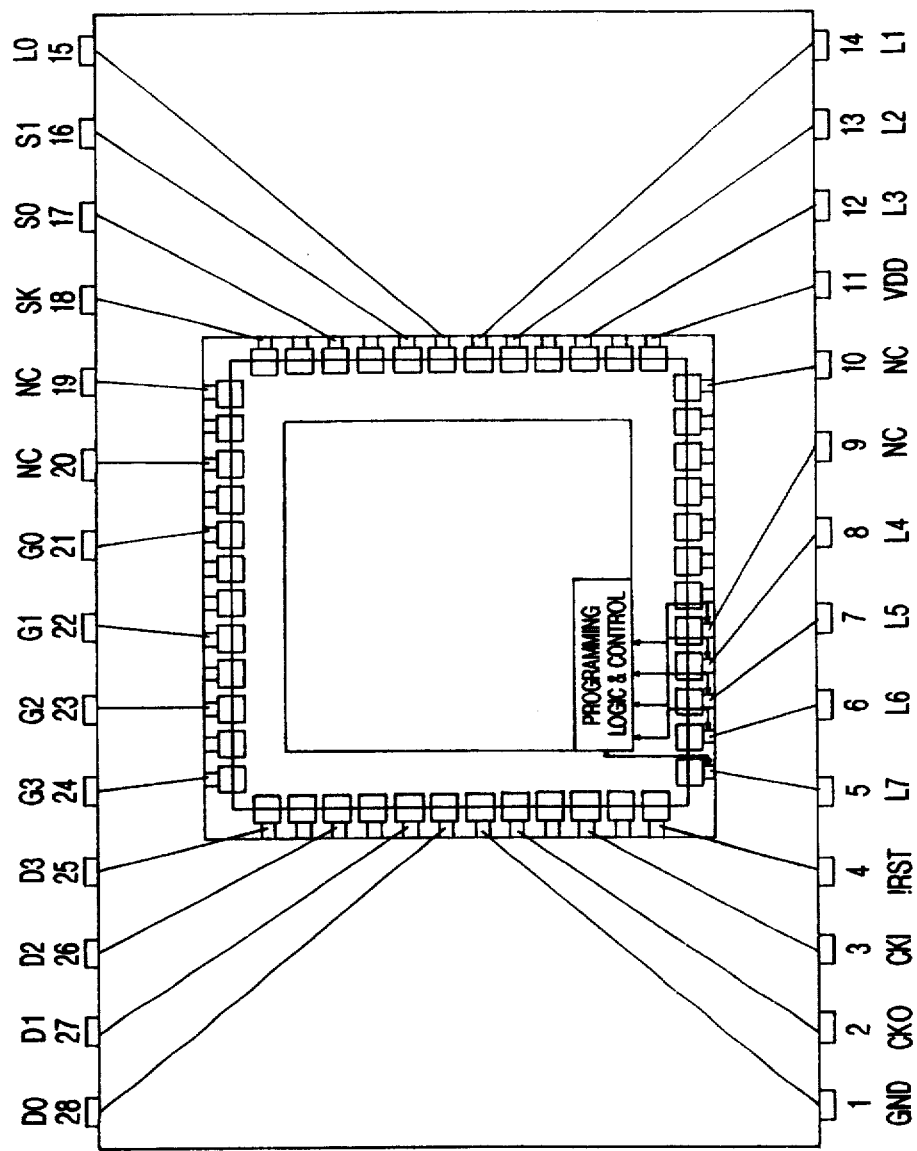
FIG. 4 is an overview of the architecture of the present invention after having been programmed and denotes the signal pins after programming.

Once the FPCA of the invention is programmed, it assumes the functionality and I/O specified by the programming data. FIG. 4 illustrates a programmed FPCA which is an example of a pin-for-pin compatible device to the National Semiconductor COP344L integrated circuit. Within the programmed FPCA the functional core is programmed to have the functionality of a COP344L. The I/O cells are also programmed to have the electrical characteristics of a COP344L. In this example, programmable power and ground is demonstrated by the fact that power now resides at lead 11 and ground at lead 1, while in another programmed FPCA power and ground may be at other leads (e.g. lead 14 and lead 28). This example also demonstrates the transparent programming of the device as all available leads are used for I/O signals and there are no leads dedicated for programming. If re-programming of the device is required, the programmer again asserts the Programming Control signal. Then, the device is programmed using the same standard programming techniques as the first time it was programmed.

The preceding example can be repeated with similar success by substituting the generically or specifically described reactants and/or operating conditions of this invention for those used in the preceding example.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A fully programmable configurable and application specific integrated circuit, said circuit comprising:
   a functional core for programming the circuit;
   at least one programmable I/O cell to be programmed for selectable electrical characteristics for circuit signals selected from the group of electrical characteristics consisting of inputs, outputs, bi-directional I/Os, power, and ground;

at least one programmable I/O lead for connecting with respective ones of said at least one programmable I/O cell;

at least one I/O pad, each routed to a respective one of said at least one programmable I/O cell;

programming logic and control for programming said functional core and said at least one programmable I/O cell; and at least one programming control lead for communicating with said programming logic and control through said at least one I/O pad.

2. The circuit of claim 1 wherein said functional core comprises a field programmable gate array, and wherein said at least one programming control lead comprises the same lead as said at least one programmable I/O lead.

3. The circuit of claim 1 wherein said at least one programmable I/O cell comprises at least one programmable I/O cell to be programmed for a logic type selected from the group of logic types consisting of TTL, CMOS, and Schmitt trigger, and wherein said at least one programmable I/O cell comprises at least one programmable I/O cell to be programmed as an input selected from the group of inputs consisting of input only, input with pull-up, input with pull-down, crystal oscillator clocks, inverting clocks, and non-inverting clocks;

wherein said at least one programmable I/O cell comprises at least one programmable I/O cell to be programmed as an output selected from the group of outputs consisting of output only, output with pull-up, output with pull-down, output with slew rate, tri-state, tri-state with pull-up, tri-state with pull-down, tri-state with slew rate, slew rate with pull-up, slew rate with pull-down, crystal oscillator clocks, inverting clocks, and non-inverting clocks; and wherein said at least one programmable I/O cell comprises at least one programmable I/O cell to be programmed as bi-directional I/O.

4. The circuit of claim 1 further comprising:

metal layers for routing circuit signals;

non-volatile memory for selecting electrical characteristics; and transparent programming for routing any signal to any lead;

wherein said transparent programming for routing any signal to any lead comprises at least one configuring element selected from the group of elements consisting of non-volatile switch elements and fuse elements; and at least one mechanism for isolating said at least one I/O cell from programming, selected from the group of mechanisms consisting of multiplexers, tri-state buffers, and signal switching mechanisms.

5. A method of fully programming and configuring an application specific integrated circuit, the method comprising the steps of:

a) selecting electrical characteristics for the circuit signals from the group consisting of inputs, outputs, bi-directional I/Os, power, and ground;

b) connecting at least one programming I/O lead to respective ones of at least one programmable I/O cell;

c) routing at least one I/O pad to respective ones of the at least one programmable I/O cell;

d) providing programming logic and control for programming a functional core and the at least one programmable I/O cell;

e) communicating with the programming logic and control and the at least one I/O cell with at least one programming control lead;

f) programming the functional core of the circuit; and g) programming the at least one programmable I/O cell for the selected electrical characteristics.

6. The method of claim 5 wherein the step of programming the functional core of the circuit comprises programming a field programmable gate array;

wherein the step of communicating with the programming logic and control and the at least one I/O cell with at least one programming control lead comprises communicating through the same lead as at least one of the programming I/O leads; and further comprising the step of routing circuit signals via metal layers;

wherein the step of selecting electrical characteristics for the circuit signals comprises selecting electrical characteristics from a non-volatile memory, and wherein the step of programming the at least one programmable I/O cell for the selected electrical characteristics comprises routing any signal to any lead with transparent programming;

wherein the step of routing any signal to any lead with transparent programming comprises configuring the at least one programmable I/O cell with a non-volatile switch element; and wherein the step of routing any signal to any lead with non-volatile programming comprises configuring the at least one programmable I/O cell with a fuse element.

7. The method of claim 5 wherein the step of selecting electrical characteristics for the circuit signals comprises selecting a logic type for the at least one programmable I/O cell selected from the group of logic types consisting of TTL, CMOS, and Schmitt trigger;

wherein the step of selecting electrical characteristics for circuit signals comprises selecting an electrical characteristic for each of the at least one I/O cell selected from the group of characteristics consisting of inputs, outputs, bi-directional I/Os, power, and ground;

wherein the step of selecting an electrical characteristic for each of the at least one I/O cells comprises programming each of the at least one I/O cells as an input selected from the group of inputs consisting of input only, input with pull-up, input with pull-down, crystal oscillator clocks, inverting clocks, and non-inverting clocks; and wherein the step of selecting an electrical characteristic for each of the at least one I/O cells comprises programming each of the at least one I/O cells as an output selected from the group of outputs consisting of output only, output with pull-up, output with pull-down, output with slew rate, tri-state, tri-state with pull-up, tri-state with pull-down, tri-state with slew rate, slew rate with pull-up, slew rate with pull-down, crystal oscillator clocks, inverting clocks, and non-inverting clocks.

8. A method of programming a fully programmable and configurable application specific integrated circuit, the method comprising the steps of:

a) asserting a programming control signal;

b) applying programming voltage and ground to designated I/O cells' leads;

c) isolating a plurality of I/O cells from the programming signals; and d) programming the isolated I/O cells of the circuit.

9. The method of claim 8 wherein the step of isolating a plurality of I/O cells from the programming signals comprises providing a control signal to isolate the programming signals from the I/O cells upon application of programming voltage and ground to designated I/O cells' leads;

wherein the step of isolating a plurality of I/O cells from the programming signals comprises isolating a plurality of I/O cells from the programming signals with a mechanism selected from the group consisting of multiplexers, tri-state buffers, and signal switching mechanisms;

wherein the step of programming the isolated I/O cells of the circuit comprises programming with at least one signal selected from the group of signals consisting of programming voltage, programming ground, programming read/write, programming control, and programming data;

wherein the step of programming the isolated I/O cells of the circuit comprises programming with a mechanism selected from the group of mechanisms consisting of a programming station and a probe station, and wherein the step of programming the isolated I/O cells of the circuit comprises transferring programmed data to non-volatile memory with logic and control circuitry.

* * * * *